United States Patent
Decre et al.

(10) Patent No.: US 6,709,705 B2
(45) Date of Patent: Mar. 23, 2004

(54) METHOD OF PRODUCING A TRACK ON A SUBSTRATE

(75) Inventors: Michel Marcel Jose Decre, Eindhoven (NL); Paulus Cornelis Duineveld, Eindhoven (NL); Jeroen Herman Lammers, LeuvenEindhoven (BE); Dirkjan Bernhard Van Dam, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 55 days.

(21) Appl. No.: 10/052,384

(22) Filed: Jan. 18, 2002

(65) Prior Publication Data

US 2002/0098292 A1 Jul. 25, 2002

(30) Foreign Application Priority Data

Jan. 24, 2001 (EP) .............................. 01200240

(51) Int. Cl.[7] .............................. B05D 1/34; B05D 5/12
(52) U.S. Cl. ..................... 427/261; 427/58; 427/258; 427/421
(58) Field of Search .................. 427/58, 117, 118, 427/258, 261, 286, 287, 421, 424; 349/187, 139; 347/101, 117, 174, 175

(56) References Cited

U.S. PATENT DOCUMENTS 3,811,915 A  *  5/1974  Burrell et al.
6,153,263 A  * 11/2000  Haruta et al.

FOREIGN PATENT DOCUMENTS

WO          WO0159854          8/2001

* cited by examiner

Primary Examiner—Fred J. Parker

(57) ABSTRACT

A method of providing a track (12) on a substrate (10) includes a first step wherein a first liquid (1) is applied to the substrate (10) in accordance with a desired double pattern (11) and, upon solidification of said first liquid, a second step wherein a second liquid (2) is applied within the double pattern (11), forming the track (12) upon solidification. The double pattern (11) laterally bounds the track (12). The liquids (1, 2) may be applied by a dispenser or an ink jet printer. The first and the second step may be carried out in one operation, wherein the application of the first liquid (1) has a lead (3) over the application of the second liquid (2). A narrow track (12) may be formed when the first liquid (1) has a head group that adheres to the substrate (10) and a tail that repels the second liquid (2).

12 Claims, 1 Drawing Sheet

METHOD OF PRODUCING A TRACK ON A SUBSTRATE

TECHNICAL FIELD

The invention relates to a method of producing a track on a substrate, wherein a relief pattern of a first solidified liquid is provided on the substrate to laterally bound the track, and a second liquid is provided within the relief pattern by spraying, while a spraying nozzle and the substrate are moved with respect to each other, said second liquid having an advancing spraying front, and the track resulting from said liquid upon solidification thereof.

BACKGROUND AND SUMMARY OF THE INVENTION

A prior art method of producing a track on a substrate is described in patent application Ser. No. WO 99 20 418.8 (PHN17.155).

In accordance with this method, the relief pattern is obtained by photolithography. In this process, the entire substrate is covered with a photosensitive liquid layer which, after solidification, is exposed via a mask and developed. The second liquid is applied by ink jet printing. The relief pattern may bound a layer of the second liquid, which is applied in a thickness up to six times the thickness of the relief pattern.

This method has the drawback that it comprises many operations: applying and spreading the liquid, drying, exposing, developing and drying, making said method time-consuming and hence expensive. In addition, said method requires a mask, a quantity of liquid large enough to cover the entire substrate, although only the liquid ending up in the relief pattern is used, as well as developing liquid.

A further drawback of said method resides in that, if the relief pattern is no longer used after the application of the tracks, said relief pattern is difficult to remove.

It is an object of the invention to provide a method of producing a track on a substrate by which a track can be readily and rapidly manufactured on a substrate.

In accordance with the invention, this object is achieved in that the relief pattern is produced by providing the first liquid by spraying, which first liquid has a spraying front, and allowing said liquid to solidify before providing the second liquid.

The method has the advantage that the first liquid is applied only at locations where it is necessary, so that the use of excess liquid is precluded. A further advantage of the method resides in that the use of a mask is precluded. The relief pattern is formed by controlling the spraying nozzle with respect to the substrate.

The spraying operation can be carried out, for example, by means of a spraying nozzle, which is a dispenser, the relevant liquid being forced outwards in the form of a jet. The spraying operation may alternatively be carried out by ink jet printing, in which process the spraying nozzle is an ink jet printing head that discharges droplets of the relevant liquid and deposits them on the substrate, after which these droplets spread so as to form the relief pattern or the track.

The first liquid may solidify as a result of evaporation of a diluting agent from the liquid, as is the case, for example, when use is made of a positive photoresist; but when use is made of a negative photoresist, further solidification may be obtained, if necessary, by irradiating, for example exposing, the relief pattern, causing crosslinking of molecules in the pattern. It is alternatively possible to employ a melt which solidifies, during or after deposition, as a result of coagulation.

In an attractive modification of the method in accordance with the invention, the first liquid and the second liquid are applied in one operation, wherein the spraying front of the first liquid has a lead over the spraying front of the second liquid. Said lead of the spraying front of the first liquid serves to enable the deposited first liquid to solidify before the spraying front of the second liquid arrives. The risk that the liquids merge is thus precluded. If necessary, solidification of the first liquid can be accelerated by heating the substrate and/or the relief pattern and/or by blowing a dry gas over the substrate. If use is made of a melt, the temperature of said melt will generally be close to its coagulation temperature, so that solidification occurs as a result of contact with the colder substrate. If necessary, however, a gas stream can be blown over the deposited liquid to increase heat dissipation and accelerate coagulation. Said melt may be, for example, a polymeric compound or a comparatively high-molecular compound, for example a waxlike compound such as a paraffin or a mixture of paraffins.

In a particular embodiment, the first liquid comprises a compound with a head group that bonds to the substrate, for example by adsorption, and a tail that avoids the substrate and repels the second liquid. This embodiment has the advantage that the relief pattern may have a very small, monomolecular thickness of several nm, for example 2 nm, as a result of which said relief can be readily removed, if necessary, at a later stage, for example by means of a glow discharge. Despite the very small thickness of the relief, a track of substantial thickness after solidification can be provided, for example a thickness of 100 nm, which is a factor of 50 thicker than the relief pattern.

The method in accordance with the invention has the advantage that a track having a small width, for example 10 $\mu$m, can be obtained, said width being smaller than the width, for example 100 $\mu$m, over which a droplet of the second liquid isolated from other droplets would spread over the substrate in the absence of the relief pattern. The method nevertheless enables a track having a larger thickness to be obtained, at said comparatively small width, than would be possible in the absence of the relief pattern, if droplets of the second liquid are deposited at the largest possible distance from each other at which said droplets still merge to form a continuous track.

The first liquid may comprise a compound selected from the group formed by compounds with an alkoxysilyl group, compounds with a halosilyl group and compounds with a thiol group. These compounds adhere to the substrate, generally by, for example, a condensation reaction with hydroxyl groups that may be present at the substrate. Examples of these compounds are: alkoxysilylalkanes, for example those derived from alkanes having 12 to 22, in particular 16 to 20 carbon atoms, such as trimethoxysilyloctadecane, the corresponding halosilylalkanes, such as chlorosilylalkanes, for example monochloro or trichlorosilyloctadecane, and the corresponding thiols, such as octadecylmercaptane [$CH_3(CH_2)_{17}SH$]. Alternatively, fluorocarbon polymers, such as FC 725 manufactured by 3M, may be applied in the first liquid.

Thiols, also referred to as mercaptanes, are attractive because they are comparatively volatile and, during the manufacture of the relief pattern, thiol vapor immediately deposits next to the deposited droplets, which thiol vapor hampers the lateral spread of the deposited droplet, which phenomenon is commonly referred to as autophobic pinning, thereby making sure that the pattern remains narrow. The first liquid may comprise a diluting agent, such as ethanol, heptane and acetone.

The substrate may be made of different materials. For example, it may be made of glass, silicon, germanium, ceramics such as aluminum oxide, or synthetic resin. Said substrate may be provided with a coating, for example of gold, silver, platinum, copper, aluminum, indium tin oxide, aluminum tin oxide, at the location of the relief pattern and/or between the relief pattern.

The second liquid may be a solution or a dispersion of a conductor, for example a metal or a conductive polymer, such as polyaniline, poly-3,4-ethylenedioxythiophene (PEDOT) or a polymer derived therefrom, a semiconductor such as polythienylenevinylene (PPV), poly(3-hexylthiophene) and pentacenes, silicon having a particle size of, for example, several nanometers, germanium CdSe, $(C_6H_5C_2H_4NH_3)_2SnI_4$, or a luminescent substance, such as $Y_2O_3$ doped with Eu, or an electroluminescent substance, for example an organic electroluminescent substance of both a comparatively high and a comparatively low molecular weight. The skeleton of such an electroluminescent substance may be essentially a conjugated skeleton, such as polythiophenes, polyphenylenes, polythiophenevinylenes, in particular, for example, blue-emitting poly(alkyl) fluorenes and/or red, green or yellow-emitting poly-p-phenylenevinylenes.

The second liquid may comprise a diluting agent, such as water, alcohol, chloroform, toluene, tetrahydrofuran.

The method can be applied in the manufacture of, for example, electronic components such as displays, for example LCD displays, for example active matrix liquid crystal displays, polymeric LEDs.

These and other aspects of the invention will be apparent from and elucidated with reference to the embodiment(s) described hereinafter.

DETAILED DESCRIPTION OF THE PRESENT INVENTION

Figure 3:
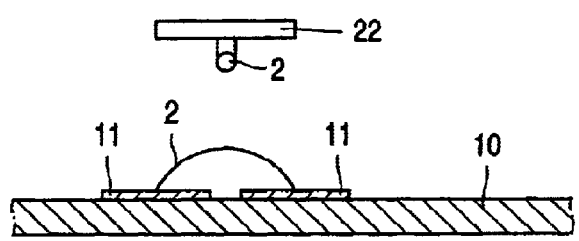
FIG. 3 is a cross-sectional view of the substrate taken on the line III—III in FIG. 1, the spraying nozzle for the second liquid being situated above the substrate.

As the Figures show, in the method of producing a track 12 on a substrate 10, a relief pattern 11 of a first solidified liquid 1 is provided on the substrate 10 to laterally bound said track 12. By spraying, while a spraying nozzle 22 and the substrate 10 are moved relatively to each other, in FIG. 1 spraying nozzle 22, see FIG. 3, is moved in the direction indicated by means of arrow P, a second liquid 2 is provided within the relief pattern 11. Said liquid 2 has an advancing spraying front 32. The liquid 2 solidifies thereby forming the track 12.

Figure 1:
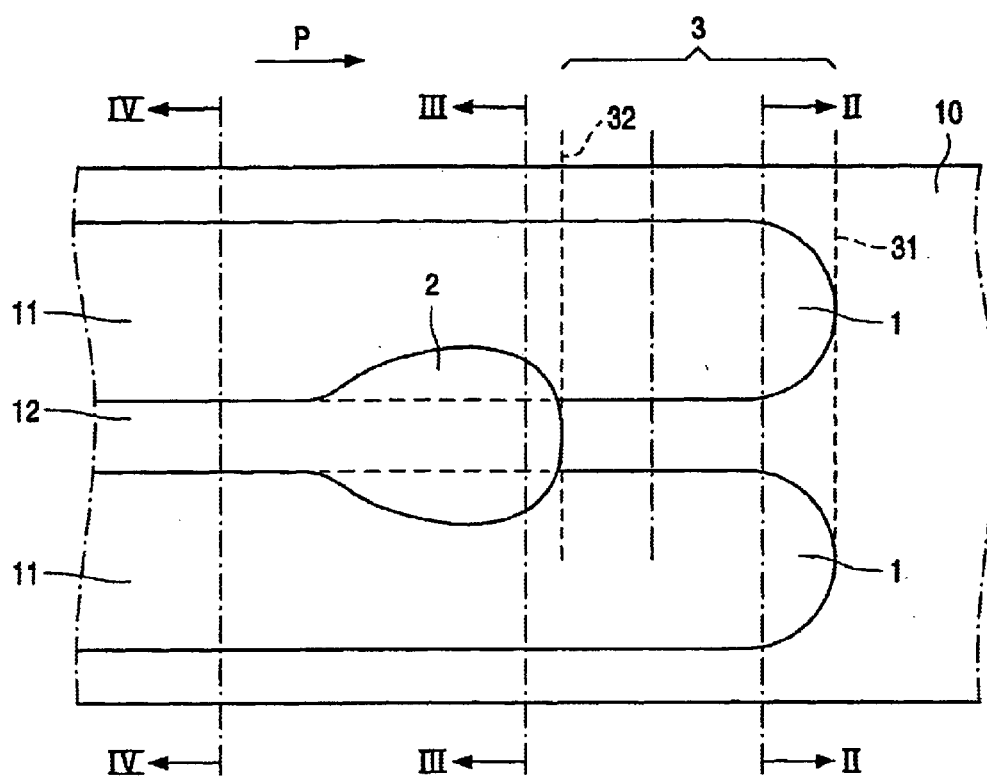
FIG. 1 is a plan view of a substrate when the method is being carried out.
Figure 2:
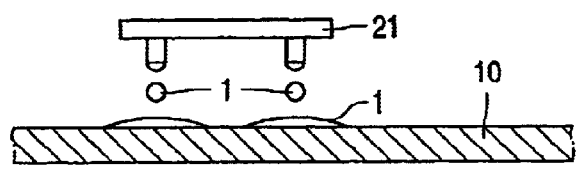
FIG. 2 is a cross-sectional view of the substrate taken on the line II—II in FIG. 1, the spraying nozzle for the first liquid being shown above said substrate.

FIG. 2 shows that the relief pattern 11 is produced by spraying the first liquid 1 using a spraying nozzle 21, which is also moved with respect to the substrate 10 in the direction indicated by means of arrow P, see FIG. 1. Said first liquid 1 has a spraying front 31. The first liquid 1 is allowed to solidify before the second liquid 2 is applied.

FIG. 1 and FIGS. 2 and 3 jointly show that the first liquid 1 and the second liquid 2 are applied in one operation. The spraying front 31 of the first liquid 1 has a lead 3 over the spraying front 32 of the second liquid 2, which lead serves to make sure that the second liquid 2 does not contact the first liquid 1 until after said first liquid has solidified at least substantially.

The first liquid 1 comprises a compound with a head group which bonds to the substrate 10 and a tail which avoids the substrate 10 and repels the second liquid 2.

In a favorable embodiment, the first liquid 1 comprises a compound selected from the group formed by compounds with an alkoxysilyl group, compounds with a halosilyl group and compounds with a thiol group, more particularly, a compound with a thiol group.

FIGS. 2 and 3 show that the first liquid 1 and the second liquid 2 are provided by ink jet printing. The liquids 1, 2 are deposited in the form of droplets, not in the form of jets produced by a dispenser.

Figure 4:
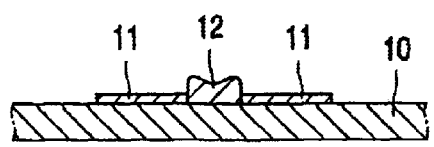
FIG. 4 is a cross-sectional view of the substrate taken on the line IV—IV in FIG. 1.

The Figures are diagrammatic as regards the dimensions of the substrate 10, the relief pattern 11 and the track 12. As a result, the Figures do not show that the track 12 may be a factor of 50 thicker than the relief pattern 11. FIGS. 3 and 4 do show, however, that the thickness of the liquid layer 2 decreases substantially when it solidifies to form the track 12, while the liquid 2 withdraws from the relief pattern.

EXAMPLE

To the surface of a glass plate a relief pattern of lanes of octadecyl trichloro silane, having a mutual distance of 50 micrometer, was applied from a solution in ethanol to obtain hydrophobic monolayers. After solidification a 12% by weight commercially available silver sol in water was ink-jet printed between the relief pattern to obtain a solidified silver track. It was observed that the silver sol in contact with the relief pattern had a contact angle of about 70 degrees, whereas when applied to the bare glass plate, it has a contact angle of only 20 degrees. The relief pattern, although being a monolayer, only, prevents the spreading of the silver sol drops. The relief pattern also straightens the boundary of the track, which in the absence of the pattern would be waviness.

What is claimed is:

1. A method of producing a track (12) on a substrate (10), the method comprising:
    spraying and solidifying a first liquid (1) on the substrate (10) to form a removable relief pattern (11) on the substrate (10) for laterally bounding the track (12); and
    spraying a second liquid (2) on at least one of the substrate (10) and the removable relief pattern (11) to form the track (12) on the substrate (10) within the removable relief pattern (11).

2. The method of claim 1,
    wherein the first liquid (1) is sprayed in a first direction along the substrate (10); and
    wherein the second liquid (2) is sprayed in the first direction along the substrate (10) subsequent to the spraying of the first liquid (1) in the first direction along the substrate (10).

3. The method of claim 1,
    wherein the first liquid (1) and the second liquid (2) are concurrently sprayed in a first direction along the substrate (10).

4. The method of claim 3, wherein a first liquid portion of the first liquid (1) sprayed on the substrate (10) solidifies into a first solid portion of the relief pattern (11) prior to a spraying of a second liquid portion of the second liquid (2) on the substrate (10) adjacent the first solid portion of the relief pattern (11).

5. The method or claim 1, further comprising:

removing the relief pattern (11) from the substrate (10) subsequent to a formation of both the relief pattern (11) and the track (12) on the substrate (10).

6. A method of producing a track (12) on a substrate (10), the method comprising:

spraying and solidifying a first liquid (1) on the substrate (10) to form a relief pattern (11) on the substrate (10) for laterally bounding the track (12); and spraying a second liquid (2) on at least one of the substrate (10) and the removable relief pattern (11) to form the track (12) on the substrate (10) within the removable relief pattern (11), wherein a first solidified portion of the first liquid (1) bonds to the substrate (10), and wherein a second solidified portion of the first liquid (1) avoids the substrate (10) and repels the second liquid (2).

7. The method of claim 6, wherein the first liquid (1) is sprayed in a first direction along the substrate (10); and wherein the second liquid (2) is sprayed in the first direction along the substrate (10) subsequent to the spraying of the first liquid (1) in the first direction along the substrate (10).

8. The method of claim 6, wherein the first liquid (1) and the second liquid (2) are concurrently sprayed in a first direction along the substrate (10).

9. The method of claim 1, wherein a first liquid portion of the first liquid (1) sprayed on the substrate (10) solidifies into a first solid portion of the relief pattern (11) prior to a spraying of a second liquid portion of the second liquid (2) adjacent the first solid portion of the relief pattern (11).

10. A method of producing a track (12) on a substrate (10), the method comprising:

spraying and solidifying a first liquid (1) on the substrate (10) to form a relief pattern (11) for laterally bounding the track (12); and spraying a second liquid (2) on at least one of the substrate (10) and the removable relief pattern (11) to form the track (l2) on the substrate (10) within the removable relief pattern (11), wherein the first liquid (1) includes a compound selected from a thoil group whereby a first solidified portion of the first liquid (1) bonds to the substrate (10) and a second solidified portion of the first liquid (1) avoids the substrate (10) and repels the second liquid (2).

11. The method of claim 6 wherein the second liquid (2) withdraws from the relief pattern (11).

12. The method of claim 10 wherein the second liquid (2) withdraws from the relief pattern (11).

\* \* \* \* \*